(12) United States Patent
Hilliger et al.

(10) Patent No.: US 7,101,785 B2
(45) Date of Patent: Sep. 5, 2006

(54) FORMATION OF A CONTACT IN A DEVICE, AND THE DEVICE INCLUDING THE CONTACT

(75) Inventors: Andreas Hilliger, Kanagawa-ken (JP); Stefan Gernhardt, Kanagawa-ken (JP); Uwe Wellhausen, Dresden (DE); Karl Hornik, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/625,483

(22) Filed: Jul. 22, 2003

(65) Prior Publication Data

US 2005/0020054 A1 Jan. 27, 2005

(51) Int. Cl.
*H01L 21/4763* (2006.01)
(52) U.S. Cl. ...................... 438/629; 438/672
(58) Field of Classification Search ................ 257/532; 438/639, 627, 648, 689
See application file for complete search history.

(56) References Cited

U.S. PATENT DOCUMENTS

| 5,583,068 | A |  | 12/1996 | Jones, Jr. et al. | |
|---|---|---|---|---|---|
| 5,595,937 | A |  | 1/1997 | Mikagi | |
| 6,156,664 | A |  | 12/2000 | Gau | |
| 6,524,957 | B1 | * | 2/2003 | Merchant et al. | 438/687 |
| 6,624,066 | B1 | * | 9/2003 | Lu et al. | 438/643 |
| 6,846,744 | B1 | * | 1/2005 | Chen | 438/700 |
| 6,878,620 | B1 | * | 4/2005 | Nguyen et al. | 438/633 |
| 2001/0006847 | A1 | * | 7/2001 | Wang et al. | 438/640 |
| 2002/0039837 | A1 | * | 4/2002 | Tohda et al. | 438/689 |
| 2002/0098682 | A1 | * | 7/2002 | Kim et al. | 438/627 |
| 2002/0117399 | A1 | * | 8/2002 | Chen et al. | 205/125 |
| 2002/0177303 | A1 | * | 11/2002 | Jiang et al. | 438/653 |
| 2003/0017669 | A1 | * | 1/2003 | Kiyotoshi et al. | 438/245 |
| 2003/0087520 | A1 | * | 5/2003 | Chen et al. | 438/643 |
| 2003/0098466 | A1 | * | 5/2003 | Morozumi | 257/200 |
| 2003/0122174 | A1 |  | 7/2003 | Fukuzumi | |
| 2003/0139017 | A1 | * | 7/2003 | Park | 438/396 |
| 2003/0160333 | A1 | * | 8/2003 | Kim et al. | 257/774 |
| 2004/0102035 | A1 | * | 5/2004 | Lee | 438/637 |
| 2005/0064708 | A1 | * | 3/2005 | May et al. | 438/687 |
| 2005/0186755 | A1 | * | 8/2005 | Smythe et al. | 438/424 |

FOREIGN PATENT DOCUMENTS

| EP | 1 233449 | * | 8/2002 |
|---|---|---|---|
| GB | 2361582 | * | 10/2001 |
| JP | 9-063989 | * | 3/1997 |
| JP | 2002-280387 | * | 9/2002 |

* cited by examiner

*Primary Examiner*—Nathan J. Flynn
*Assistant Examiner*—Ahmed N. Sefer
(74) *Attorney, Agent, or Firm*—Fish & Richardson P.C.

(57) ABSTRACT

A method of forming a contact to an underlayer of a device includes the steps of forming a contact hole, forming a contact hole barrier layer of a barrier material in the contact hole of the device, etching the contact hole barrier layer on the bottom surface of the contact hole, depositing a liner material in the contact hole, and filling the contact hole with a conductive material. A device such as a semiconductor, passive device, capacitor or FeRAM is formed in accordance with the method. The portions of the contact hole barrier layer on the side walls of the contact hole inhibit lateral diffusion of hydrogen and/or oxygen. The contact hole barrier layer can be performed after a wet etch process to fill voids in an existing barrier layer caused by that process, or prior to the wet etch process to prevent damage to the existing barrier layer.

7 Claims, 6 Drawing Sheets

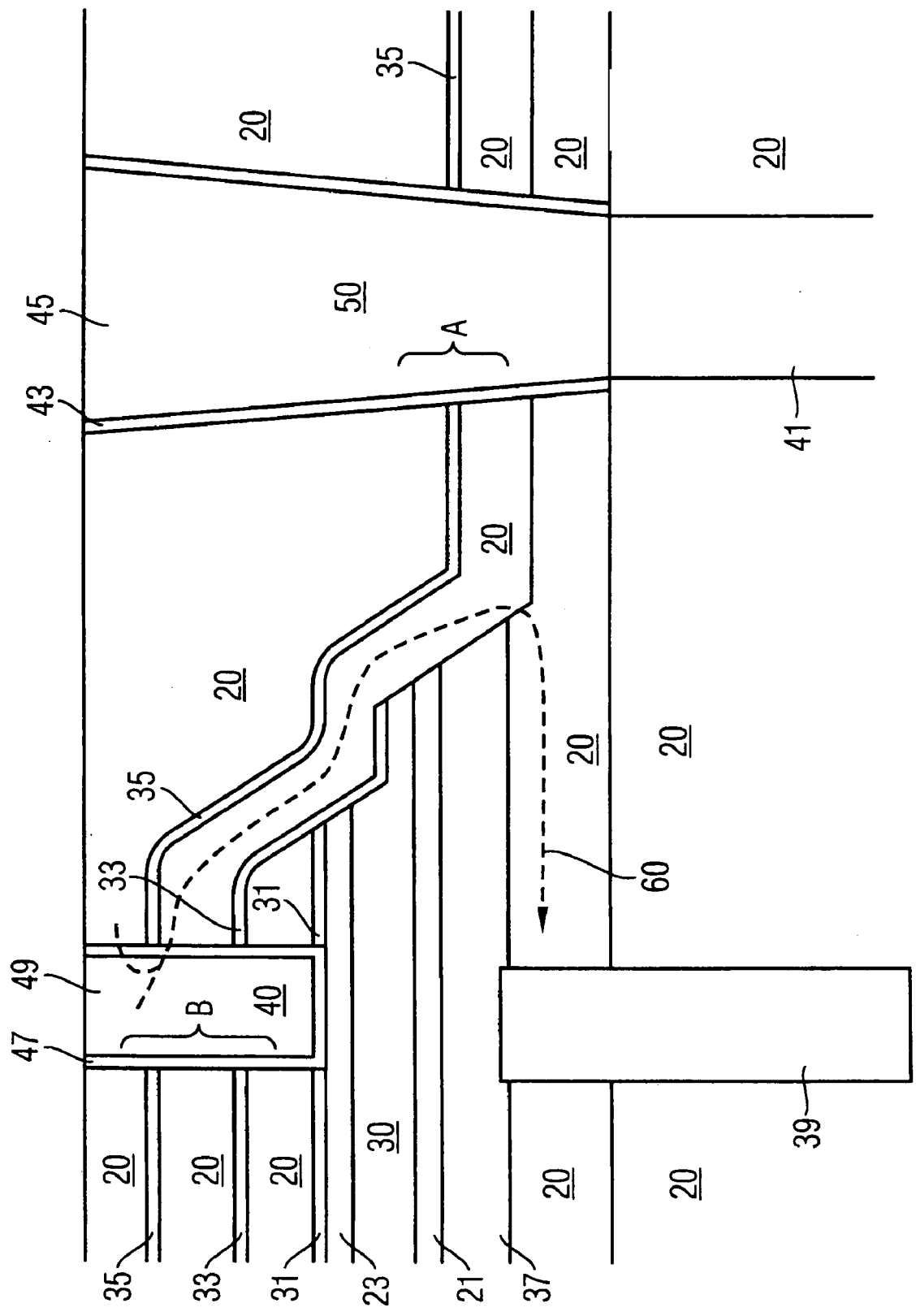

FORMATION OF A CONTACT IN A DEVICE, AND THE DEVICE INCLUDING THE CONTACT

FIELD OF THE INVENTION

The present invention relates to a method of producing a contact in a portion of a device, for example a semiconductor or similar device, and to a passive device such as a capacitor formed by the method. In particular the device may be a ferroelectric capacitor (FeRAM).

BACKGROUND OF THE INVENTION

Conventionally, an FeRAM is manufactured by depositing a ferroelectric film, such as lead zirconate titanate (PZT), strontium bismuth tantalum oxide (SBT), bismuth lanthanum titanium oxide (BLT) or strontium ruthenium oxide (SRO) on a first, or bottom, planar, electrode film, and forming a second, or top, electrode film over the ferroelectric layer. The second electrode layer and the ferroelectric film are then etched using a reactive ion etch method, after which the first electrode film is etched using a similar method. The result is a number of stacks comprising a first and second electrode film sandwiching the ferroelectric film.

After etching of the individual FeRAM capacitor structure, it is conventional to form a CAP layer of $Al_2O_3$ to prevent hydrogen diffusion into the structure. This layer can be formed by a sputtering process. It is important to seek to prevent hydrogen diffusion into the structure as this may damage the device.

In the manufacture of other devices, including semiconductor devices, it is known to form a layer of material such as $Al_2O_3$ over the device to prevent hydrogen diffusion. Such diffusion may otherwise affect the properties and performance of the device. Usually an upper insulation layer is also applied.

With such devices, it may be necessary to form an electrical contact with the underlying region or layer, for example with wells in the substrate material, or directly to an underlying layer, for example to a first electrode of an FeRAM. Such an electrical contact maybe formed by forming a contact hole through the overlying layers to an underlying layer or region, and filling the contact hole subsequently with electrically conductive material, such as aluminium. Where the device includes a barrier layer, the contact hole must be formed through the barrier layer to an underlying layer. To ensure low contact resistivity and high reliability, a wet etching treatment is applied. Due to the different etch rates of the different etched layers, steps and/or voids can be formed in the sidewalls of the contact holes. In ferroelectric devices, the barrier or encapsulation (CAP) layers can be pulled or etched back relative to other layers. Next, a thin liner layer is deposited in order to ensure proper filling of conductive material, such as aluminium, into the contact hole. The liner material is usually comprised of Ti or TiN. Even if the liner material is made of a material capable of preventing or reducing hydrogen diffusion, the liner is still ineffective since it is unable to fully fill the steps and/or voids. The resulting voids between the contact liner and the barrier layer creates a leakage path for the hydrogen.

An example of this form of structure is illustrated in FIG. 10, which shows a portion of an FeRAM device is shown. The device includes a ferroelectric capacitor which comprises a bottom electrode 21 and a top electrode 23. Between them is a ferroelectric layer 30. The ferroelectric capacitor is supported within a matrix of TEOS 20. The bottom electrode 21 is connected via an electrically conductive barrier layer 37 of Ir and/or $IrO_2$ to a conductive plug 39 which extends to lower levels of the device. The top electrode 23 is in contact with a top electrode contact well 40, which is a cavity in the TEOS 20, lined with a liner layer of conductive material 47 and filled with a metal 49. Lower layers of the device (not shown) are electrically connected to a conductive element 41. The element 41 extends to a deep contact well 50, which is a cavity in the TEOS 20, having an inner surface coated with a conductive liner layer 43 and being filled with a metal 45. The structur includes a number of barrier layers 31, 33, 35, which may be formed by $Al_2O_3$ for example. The purpose of the barrier layers 31, 33, 35 is to inhibit diffusion of oxygen and hydrogen through the structure. Nevertheless, diffusion paths still remain, such as the one indicated by the dashed line 60.

Each of the contact wells 40, 50 is formed by a process having the steps of (i) opening the wells 40, 50, (ii) performing a wet etch process, (iii) coating the wells 40, 50 to form the liner layers 43, 47, and (iv) filling the wells 40, 50 with metal 45, 49.

FIG. 11 is a view of the portion A of FIG. 10. In the formation of the deep contact well, 50, the wet etch process caused the portion of the $Al_2O_3$ barrier layer 35 closest to the well 50 to be removed, creating a void 61. The liner 43 does not fill this void 61, so a path indicated by the arrow exists for hydrogen to diffuse around the edge of the barrier layer 35.

FIG. 12 is a view of the portion B of FIG. 10 during the formation of the deep contact well 50 and before the liner 47 is applied. At this stage an annealing operation is being carried out (e.g. to crystallise the PZT layer 30) In an oxygen atmosphere, and $O_2$ is able to diffuse into the TEOS material 20 along the paths indicated by arrows.

FIG. 13 is a view of the portion B after the wet etching step, and after the liner 47 and metal material 43 have been inserted into the top electrode contact well 40. The wet etching step caused the portions of the barrier layers 33, 35 close to the well 49 to be partially removed, creating voids 63 through which hydrogen can diffuse along paths indicated by the arrows.

It would be desirable to form a contact which would not allow undesirable materials to pass across a barrier layer.

SUMMARY OF THE INVENTION

The present invention aims to provide a new and useful method of forming a contact in structure including a barrier layer, and also to provide new and useful devices formed by the method.

According to the present invention, a method of forming a contact to an underlayer or region of a device includes the steps of forming a contact hole through the device, depositing a contact hole barrier layer in the contact hole, etching the contact hole barrier layer on the bottom surface of the contact hole, depositing a liner material in the contact hole, and filling the contact hole with a conductive material.

Any of the contact hole barrier layer remaining on the sides of the contact hole may act as a useful barrier for preventing lateral diffusion. In the case that the contact well is for a top electrode, the contact hole barrier layer inhibits diffusion of both hydrogen and oxygen. In the case that the contact well is for a deep contact, the contact hole barrier layer inhibits hydrogen diffusion.

The invention is particularly suitable in the case that the contact formation process includes a wet etch process, and the contact well is formed through a portion of the device including a first barrier layer.

In a first form of the invention, the contact hole barrier layer is applied following the wet etch process, so that the contact hole barrier layer of barrier material can fill voids in the device's first barrier layer caused by the wet etch process, and thereby prevents the diffusion of hydrogen through such voids. In a second form of the invention the contact hole barrier layer is formed prior to the wet etch process. In this case, the contact hole barrier layer protects the side walls of the contact hole during the wet etch process, and in particular the first barrier layer in those side walls. If the thickness of the contact hole barrier layer on the sides of the contact hole is reduced undesirably during this wet etch process, then a further layer of the contact hole barrier layer can be applied, and then the portion of the contact hole barrier layer on the bottom surface of the contact hole removed.

The barrier material of the contact hole barrier layer is preferably $Al_2O_3$, but other barrier materials can also be used. For example, $TiO_2$. Materials such as Ti or TiN are not preferred for being applied within the top electrode contact since they will be oxidised. The barrier material does not have to be made of the same material as the first barrier layer through which the contact hole passes.

Advantageously, the contact hole barrier layer of barrier material is deposited using an atomic layer deposition (ALD) method. This has been found to achieve good filling of the voids in the barrier layer through which the contact hole passes. This method is also advantageous as it can be carried out at a low temperature, and results in the formation of a good contact hole barrier layer.

Preferably, the contact hole barrier layer at the bottom of the contact well is etched using a spacer etch method. The use of a short spacer etch of the barrier material, which can be carried out without the use of a resist, avoids the need of the normal chemical wet post treatment, prior to the subsequent oxygen annealing.

According to a second aspect of the present invention, there is provided a device including a contact formed in accordance with the method of the first aspect of the present invention. Preferably the device is a semiconductor device, or a passive device such as a capacitor, and more preferably is a FeRAM.

BRIEF DESCRIPTION OF THE DRAWINGS

The present invention will now be described, by way of example, with reference to the accompanying drawings, in which:

FIG. 9(a) shows a third step of the second method which is an embodiment of the invention in which the contact hole barrier layer is partially removed by a wet etching process, while

FIG. 10 illustrates a known FeRAM structure having a deep contact well;

DETAILED DESCRIPTION OF THE INVENTION

Figure 1:
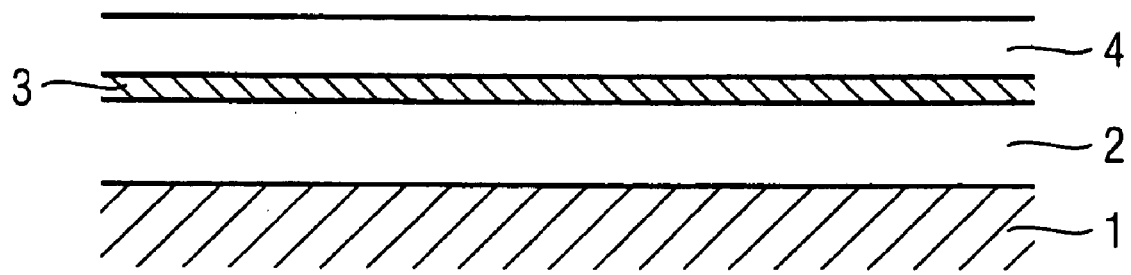
FIG. 1 shows a cross-section through a device, including a substrate, an overlayer, an underlayer and a first barrier layer.

The steps of the first method according to the invention are shown in FIGS. 1 to 6. As shown in FIG. 1, a device comprises a substrate 1, an underlayer 2, one or more overlayers 4, and a first barrier layer 3 formed of $Al_2O_3$. The first barrier layer 3 might be a barrier layer providing the encapsulation of a capacitor of an FeRam device. This barrier layer 3 may cover a hardmask used for etching the first, or bottom, electrode of the capacitor.

The layer structure of the underlayer 2 is not shown, but in the case of a FeRAM it may be formed by the conventional technique of forming a first, or bottom, electrode layer above the substrate 1, a ferroelectric layer above the first electrode layer and then a second, or upper, electrode layer above the ferroelectric layer. The upper (second) electrode layer and the ferroelectric layer are etched by the RIE method. The first electrode layer is then etched by the same method. This leaves a matrix of such capacitor elements or an isolated capacitor element on a chip comprising other components, depending on the desired application. In other applications, a well or a source/drain of a transistor, may be provided in the substrate, and in this case a contact is made to the well. Alternatively, a contact may be made to one of the overlayers from below.

The barrier layer 3 of $Al_2O_3$ can be provided to cover the external surface of the device (i.e. before the formation of the overlayer 4), for example being applied by sputtering.

Figure 2:
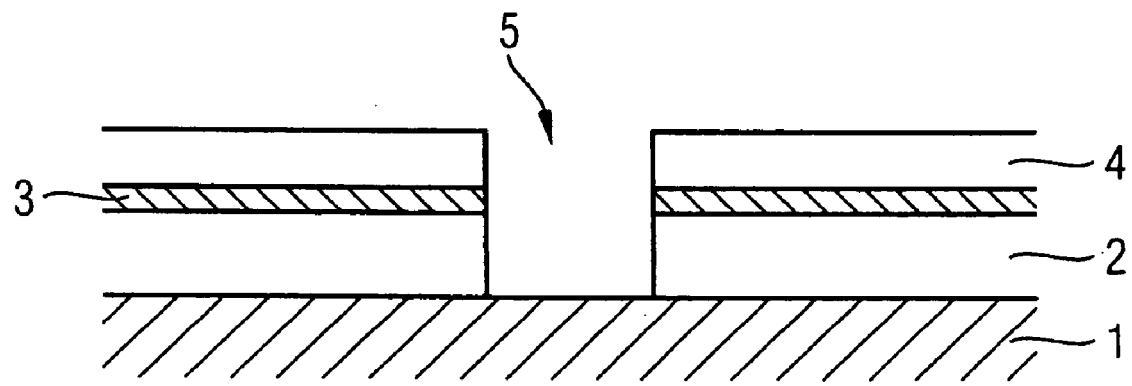
FIG. 2 shows a cross-section through the device of FIG. 1, in which a contact hole has been formed passing through the barrier layer in a first step of a first method according to the invention.

As shown in FIG. 2, a contact hole 5 is formed through the overlayer 4, the barrier layer 3 and the underlayer 2 of the device to the substrate 1. The contact hole 5 corresponds to the deep well contact hole 50 of FIG. 10 in the case that the underlayer 2 includes a first electrode layer, a ferroelectric layer, and a bottom electrode layer, all to the side of the contact hole 5. Alternatively, the contact hole 5 corresponds to the top electrode contact hole 40 of FIG. 10 in the case that the substrate 1 is a top electrode.

Figure 3:
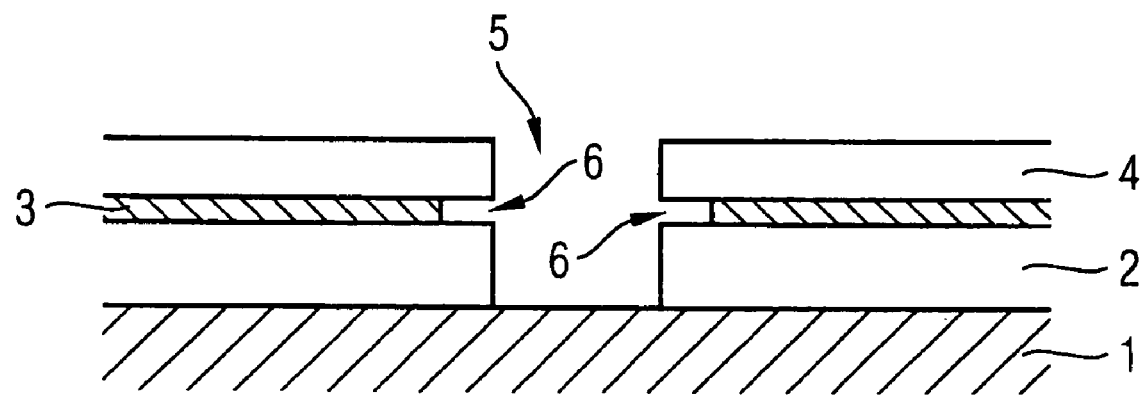
FIG. 3 shows a cross-section through the device of FIG. 1, in which a wet etch has been performed in the first method according to the invention on th contact hole so that the barrier layer through which the contact hole passes has been pulled back forming voids.

As shown in FIG. 3, the first barrier layer 3 is pulled or etched back from the contact hole relative to other layers due to the wet treatment. This etching back is due to the first barrier layer 3 having a faster etching rate than some of the other layers. This pulling back of the first barrier layer 3 results in the creation of steps or voids 6 in the sidewall of the contact hole.

Figure 4:
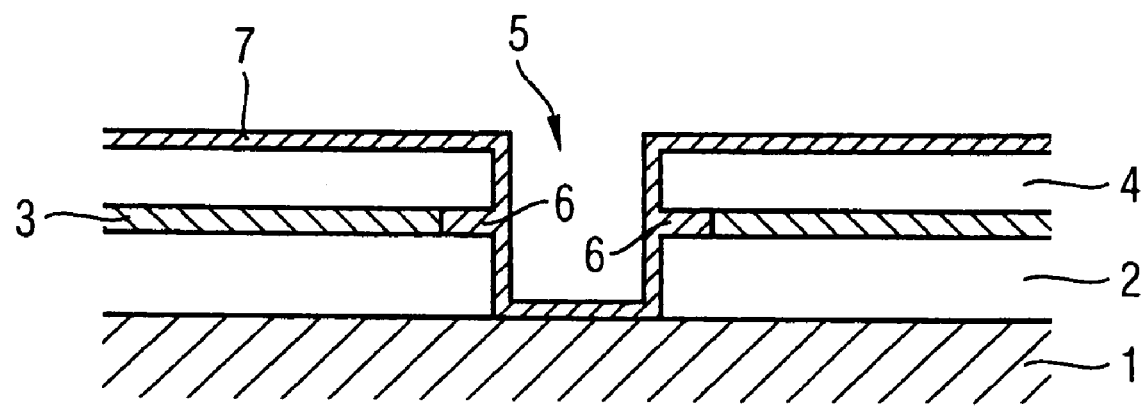
FIG. 4 shows a cross-section through the device of FIG. 1, in which a contact hole barrier layer has been deposited in the first method according to the invention.
Figure 5:
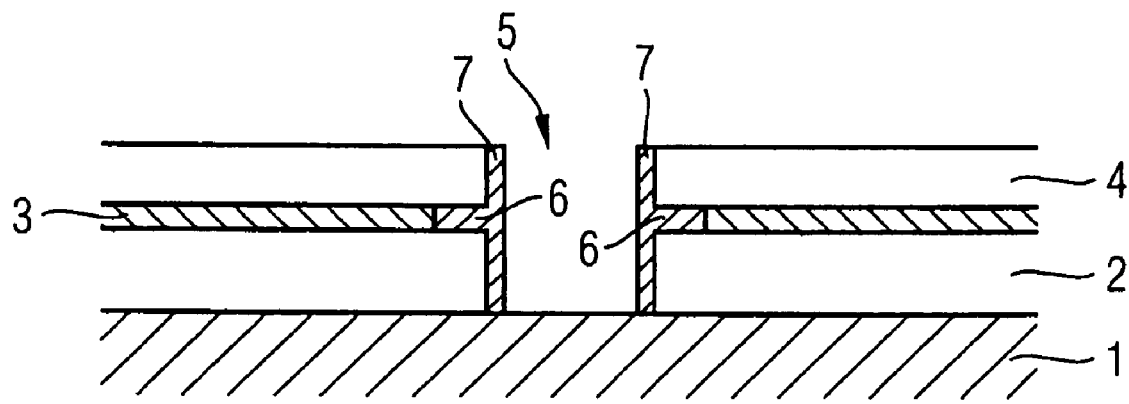
FIG. 5 shows the contact hole with the contact hole barrier layer partially removed using a spacer etch method in the first method according to the invention.

A contact hole barrier layer 7 of barrier material is deposited using an atomic layer deposition (ALD) method. Alternatively, the contact hole barrier layer 7 can be deposited using other methods such as chemical vapour deposition (CVD). As shown in FIG. 4, the contact hole barrier layer 7 substantially fills the voids 6 in the barrier layer 3 around the contact hole 5 and covers the bottom of the contact hole.

The contact hole barrier layer 7 is then partially removed in the contact hole 5, for example using a spacer etch method. The contact hole barrier layer 7 is removed from the horizontal contact area and is kept at the vertical sidewalls. The resulting contact hole therefore includes a thin layer of barrier material 7 on the side walls of the contact hole, thereby acting to block the diffusion of hydrogen into the capacitor (see FIG. 5).

Figure 6:
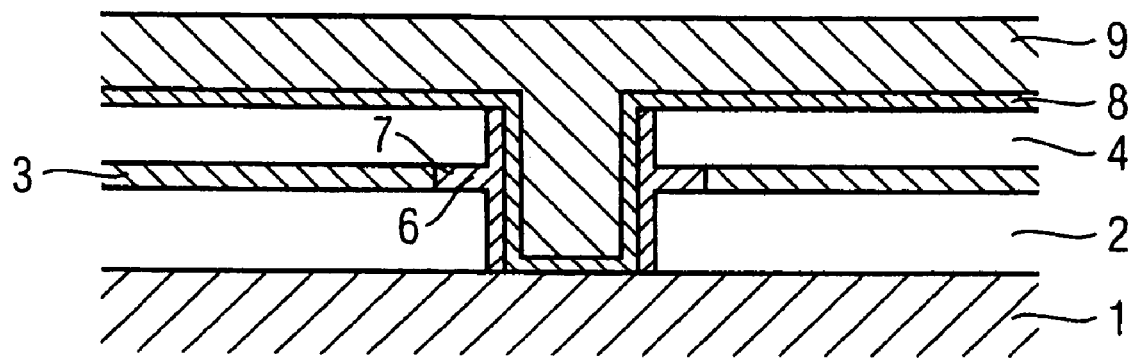
FIG. 6 shows the contact hole after depositing a liner layer and filling of the contact with a conductive material in the first method according to the invention.

FIG. 6 shows the contact hole after depositing a liner layer 8 (a conductive material such as TiN) to promote subsequent filling of the contact with a conductive material 9 such as Aluminium (Al) or Tungsten (W).

Figure 7:
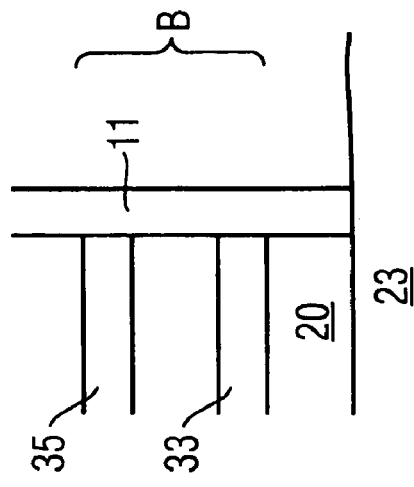
FIG. 7 shows a first step of a second method which is an embodiment of the present invention, in which a contact hole barrier layer is formed in a contact hole.
Figure 8:
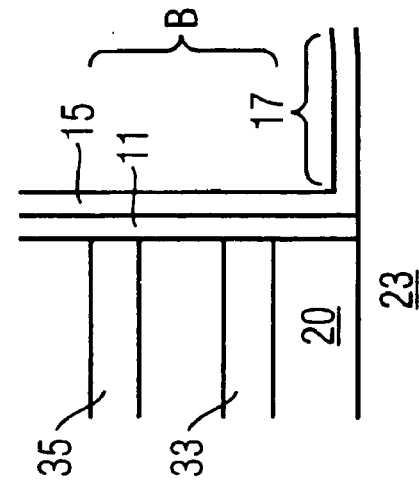
FIG. 8 shows a second step of the second method which is an embodiment of the invention in which the contact hole barrier layer has been etched on the bottom surface of the contact hole.
Figure 9A:
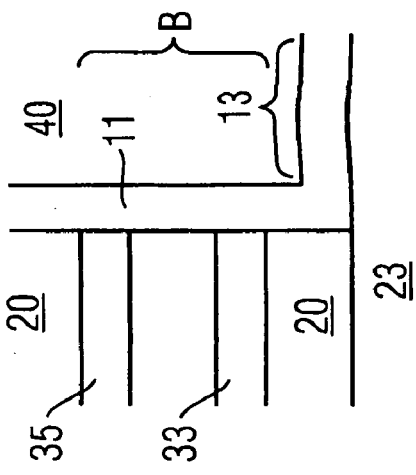
Figure 9B:
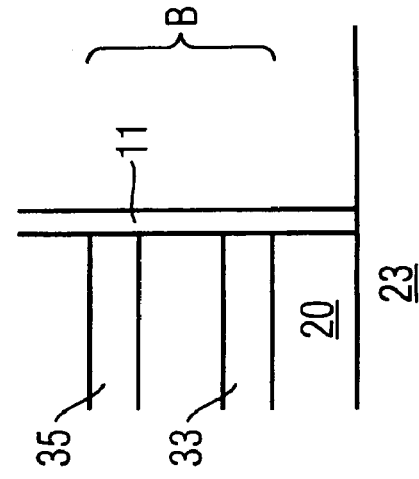
FIG. 9(b) shows a step which can optionally follow the third step.
Figure 11:
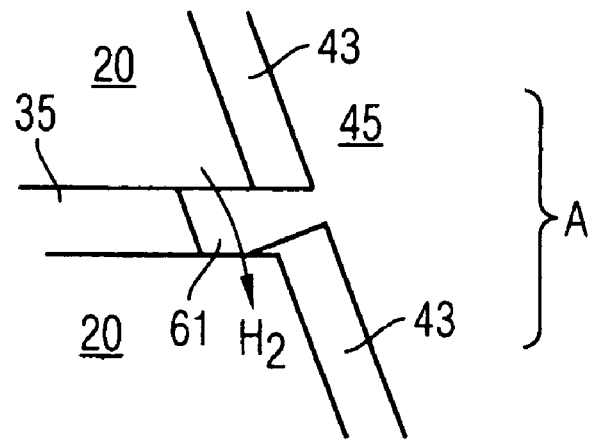
FIG. 11 illustrates leakage of hydrogen in the deep contact well of the structure of FIG. 10.

FIGS. 7 to 10 show a second method according to the invention. This method is explained in relation to a top electrode contact well, and the portions of the top electrode contact well corresponding to those of the known top electrode contact well 40 illustrated in FIG. 10 are denoted by the same reference numerals. In particular, the portion B of the device shown in FIG. 10 is illustrated in FIGS. 7 to 9.

FIG. 7 shows a time after the contact well 40 has been opened (as in the prior art method) but before the wet-etching process, According to the proposal of the invention a contact well barrier layer 11 is deposited onto all inner surfaces of the well 40. This can be performed using a sputtering process, or, more preferably, chemical vapour deposition (CVD) or atomic layer deposition (ALD).

Figure 12:
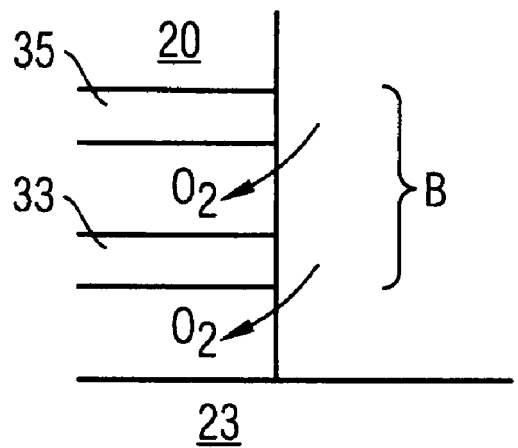
FIG. 12 illustrates oxygen diffusion in the top electrode contact well of FIG. 10

The contact well barrier layer 11 is then etched on its lower surface by RIE to remove the portion indicated as 13 on the bottom surface of the contact well 40. This produces the structure shown in FIG. 8. An annealing step in an oxygen atmosphere can now be performed to recover the ferroelectric properties of the capacitor from process damage. In FIG. 8, in contrast to FIG. 12, the paths along which the $O_2$ diffuses are blocked by the contact well barrier layer 11 which remains on the vertical sides of the contact well 40 (i.e. substantially perpendicular to the top surface of the top electrode 23). The annealing may for example be performed at a temperature of 500 to 700° C. for a period between 30 seconds and 2 hours.

Figure 13:
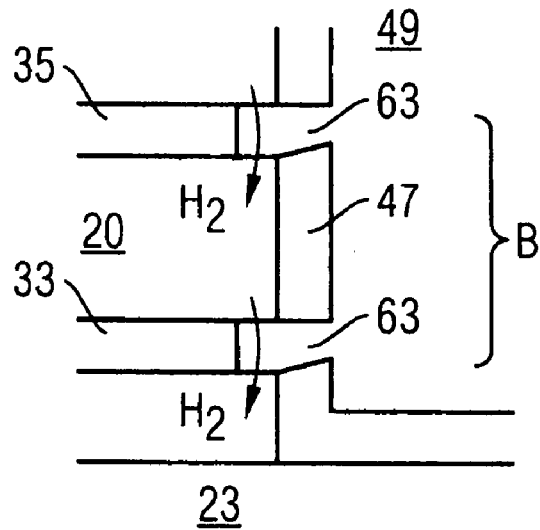
FIG. 13 illustrates hydrogen diffusion in the top electrode contact well of FIG. 10.

As in the known contact formation method, a wet-etch process is now performed. This tends to reduce the thickness of the contact well barrier layer 11, as shown in FIG. 9(a), but the contact well barrier layer 11 nevertheless prevents the layers 33, 35 from being attacked during the wet etch process. Thus, the voids 63 of FIG. 13 are not produced.

The contact well can now be completed by the steps of the prior art method applying with a liner 47, and filling the well 40 with a metal 49. The remaining portion of the barrier layer 11 acts is effective in preventing lateral diffusion of $H_2$ from the well 40 into the TEOS 20.

In the case that the thickness of the layer 11 which remains in FIG. 9(a) is not considered adequate for perform this role, optionally, before the liner 47 and metal 49 are inserted into the well 40, the layer 11 can be reinforced by a second contact well barrier layer 15. The portion 17 of the second contact well barrier layer 15 lying on the bottom surface of the contact well 40 is then removed.

Although the second method according to the invention has been explained above with reference to the top electrode contact well 40, the invention is not limited in this respect and the method may alternatively be applied for example to the deep contact well 50.

The present invention can be used to prevent the leakage of contaminants other than $H_2$ through a barrier layer. Also, etching and deposition processes other than those described above can be used. Thus, although the invention has been described above using particular embodiments, many variations are possible within the scope of the claims, as will be clear to a skilled reader.

The invention claimed is:

1. A method of forming a contact to an underlayer or region of a device comprising:
   forming a contact hole through a portion of the device including through a first barrier layer, the contact hole having sides which extend above and below the first barrier layer and having a bottom surface;
   wet etching the contact hole;
   forming a contact hole barrier layer of a barrier material in the contact hole, after wet etching the contact hole, thereby filling voids in the first barrier layer caused by the wet etching, the contact hole barrier layer being continuous between the sides and bottom surface of the contact hole;
   etching the contact hole barrier layer on the bottom surface of the contact hole;
   depositing a liner material in the contact hole to form a contact liner to promote subsequent filling of the contact hole; and
   filling the contact hole with a conductive material.

2. A method according to claim 1, in which the barrier material of the contact hole barrier layer is $Al_2O_3$ or $TiO_2$.

3. A method according to claim 1, in which the barrier material of the contact hole barrier layer is deposited using an atomic layer deposition (ALD) method.

4. A method according to claim 1, in which the device is a semiconductor device.

5. A method according to claim 1, in which the device is a passive device.

6. A method according to claim 1, in which the device is a capacitor.

7. A method according to claim 6, in which the device is an FeRAM.

* * * * *